(12) United States Patent
Stevenson

(10) Patent No.: US 7,352,281 B2
(45) Date of Patent: Apr. 1, 2008

(54) AUTOMOTIVE GAUGE SYSTEM USING A POWER LINE CARRIER

(75) Inventor: W. Timothy Stevenson, Stony Plain (CA)

(73) Assignee: Instrument Systems Inc., Stony Plain, Alberta (CA)

( * ) Notice: Subject to any disclaimer, the term of this patent is extended or adjusted under 35 U.S.C. 154(b) by 269 days.

(21) Appl. No.: 10/906,475

(22) Filed: Feb. 22, 2005

(65) Prior Publication Data
US 2006/0187021 A1  Aug. 24, 2006

(51) Int. Cl.
G08B 1/08  (2006.01)

(52) U.S. Cl. ............... 340/538; 340/310.11; 340/461; 340/525; 340/538.16; 340/825.52

(58) Field of Classification Search ........... 340/539.16, 340/538.16, 538.11, 310.12, 310.17, 461, 340/525, 825.52, 310.11, 538
See application file for complete search history.

(56) References Cited

U.S. PATENT DOCUMENTS

| 5,432,497 | A | * | 7/1995 | Briski et al. ................. 340/525 |
| 5,539,388 | A |   | 7/1996 | Modgil |
| 5,677,663 | A | * | 10/1997 | Sansome ............... 340/426.35 |
| 5,745,027 | A |   | 4/1998 | Malville |
| 5,859,584 | A |   | 1/1999 | Counsell et al. |
| 5,949,330 | A | * | 9/1999 | Hoffman et al. ............. 340/438 |
| 6,130,487 | A | * | 10/2000 | Bertalan et al. ............. 307/9.1 |
| 6,229,434 | B1 |   | 5/2001 | Knapp et al. |
| 7,107,130 | B2 | * | 9/2006 | Kondo et al. ................... 701/1 |
| 2003/0025594 | A1 |   | 2/2003 | Akiyama et al. |
| 2003/0052771 | A1 |   | 3/2003 | Enders et al. |
| 2003/0057771 | A1 |   | 3/2003 | Enders et al. |
| 2003/0076221 | A1 |   | 4/2003 | Akiyama et al. |
| 2004/0189090 | A1 |   | 9/2004 | Yanagida et al. |
| 2004/0207262 | A1 |   | 10/2004 | Yanagida et al. |
| 2004/0207263 | A1 |   | 10/2004 | Yanagida et al. |
| 2004/0245854 | A1 |   | 12/2004 | Hattori et al. |

FOREIGN PATENT DOCUMENTS

WO  WO 03/028305 A3  4/2003

* cited by examiner

Primary Examiner—Davetta W. Goins
(74) Attorney, Agent, or Firm—Bennett Jones LLP (57) ABSTRACT

A data display system including a plurality of data sources; a data transmitter coupled to the data sources and to a transmission network comprising a power line; wherein the data transmitter comprises means for modulating the data as a frequency modulated carrier and means for transmitting the carrier over the power line; and a plurality of gauges each having a display and coupled to the power line, and a data receiver comprising means for demodulating the carrier and means for translating the data to the display. The gauges are coupled to the data transmitter only by the power line, disregarding any ground connections, and the power line provides power to the gauges and the data transmitter.

17 Claims, 15 Drawing Sheets

FIGURE 4  MICROCONTROLLER

FIGURE 5 MODULATOR & OSCILLATOR

FIGURE 6  LOWPASS FILTER

FIGURE 7  AMPLIFIER

FIGURE 8   TRANSIENT PROTECTION NETWORK

FIGURE 9   COUPLING MEDIUM

FIGURE 10  POWER SUPPLY & LOWPASS FILTER

FIGURE 11  BANDPASS FILTER

FIGURE 12  TRANSIENT PROTECTION & AMPLIFIER

FIGURE 13  FREQUENCY DEMODULATOR

FIGURE 14 DATA DETECTION

FIGURE 15  MICROCONTROLLER

AUTOMOTIVE GAUGE SYSTEM USING A POWER LINE CARRIER

BACKGROUND OF INVENTION

The present invention relates to an automotive gauge system which utilizes a power line carrier.

Electrical automotive gauges are well known devices used to monitor various mechanical functions on various types of vehicles and equipment. Conventionally, these instruments have required a large wire bundle to separately supply power, sender, illumination and warning lamp information to each gauge. Typically, instrument installations can contain anywhere from thirty to over one hundred wires in some industrial applications. As a result, wiring the instrument panel can be a time-consuming and intricate process. Furthermore, large numbers of bulky wire bundles are difficult to work with, particularly in applications where space is limited, such as behind the dashboard of a vehicle.

In U.S. Pat. No. 5,539,388, a system is disclosed for transmitting and receiving telemetry and control signals over existing direct current power wiring. However, the modules in this system are all capable of two-way communication, as the system is intended primarily as control system, which adds to the complexity of the system. Furthermore, the signals are coded as a pulsed current signal. In this patent, the difficulty of using high-frequency carriers in an automotive electrical system is acknowledged. The DC power supply in an automotive system has a very low impedance, which causes difficulties when attempting to impress high-frequency carriers on a power line. As well, it is indicated that use of such control signals will interfere with other components of the system.

Therefore, there is a need in the art for an automotive gauge system using a power line carrier where multiple data sources can connect to corresponding gauges using a common transmission network.

SUMMARY OF INVENTION

The present invention provides an automotive gauge system which minimizes the required number of wires needed to supply data to all the gauges. In one embodiment, the number of wires required for a gauge panel may be as few as one or two, regardless of the number of gauges used. As a result, installation time and material costs may be reduced. As well, the space required behind the gauge panel may be minimized.

The system collects and organizes a plurality of data sources and then impresses the data upon a power line or any other uncommitted wire connecting to an integrated gauge/receiver unit. In one embodiment, the data is impressed upon the power line by means of a frequency modulated carrier which is then demodulated by the individual gauge/receiver units. In one embodiment, the power line is a 12 VDC or 24 VDC in an automotive electrical system.

The carrier is preferably a high frequency signal, having a frequency greater than about 50 KHz, preferably greater than about 75 KHz, and more preferably in the range of about 100 KHz to about 500 KHz.

In one aspect, the invention comprises a data display system comprising: (a) at least one data source; (b) a data transmitter coupled to the at least one data source and to a transmission network comprising a power line; wherein the data transmitter comprises means for modulating the data as a frequency modulated carrier and means for transmitting the carrier over the power line; (c) at least one gauge having a display and coupled to the power line, and a data receiver comprising means for demodulating the carrier and means for translating the data to the display; wherein the at least one gauge is coupled to the data transmitter only by the power line, disregarding any ground connections, and wherein the power line provides power to both the at least one gauge and the data transmitter. If the gauge is directly grounded, the power line may be the only wire connection to the gauge. Alternatively, the gauge may be grounded with a ground wire.

In one embodiment, the invention comprises a plurality of data sources and a plurality of gauges, wherein each data source has a corresponding gauge. Preferably, the data sources are connected to a single data transmitter which impresses a multiplexed carrier signal onto the transmission network. More preferably, the system involves one-way transmission of a signal, whereby the data flows from the data source, to the transmitter and to the gauge, eliminating the need for combined transmitter/receiver functions of any component within the system.

In another aspect, the invention may comprise a method of connecting a gauge panel comprising a plurality of gauges to a plurality of data sources with a transmission network consisting of a power line, the method comprising the steps of: (a) providing power to each gauge and a data transmitter with the power line; (b) modulating the data received from the data sources as a frequency modulated carrier and transmitting the carrier over the power line; and (c) demodulating the carrier in the corresponding gauge, selecting data relevant to the corresponding gauge and displaying the relevant data as a human readable display.

BRIEF DESCRIPTION OF DRAWINGS

The invention will now be described by way of an exemplary embodiment with reference to the accompanying schematic drawings. In the drawings.

DETAILED DESCRIPTION

The present invention provides for a method and apparatus for transmitting a plurality of data sources to a number of gauges using a common power line carrier. When describing the present invention, all terms not defined herein have their common art-recognized meanings.

Figure 1:
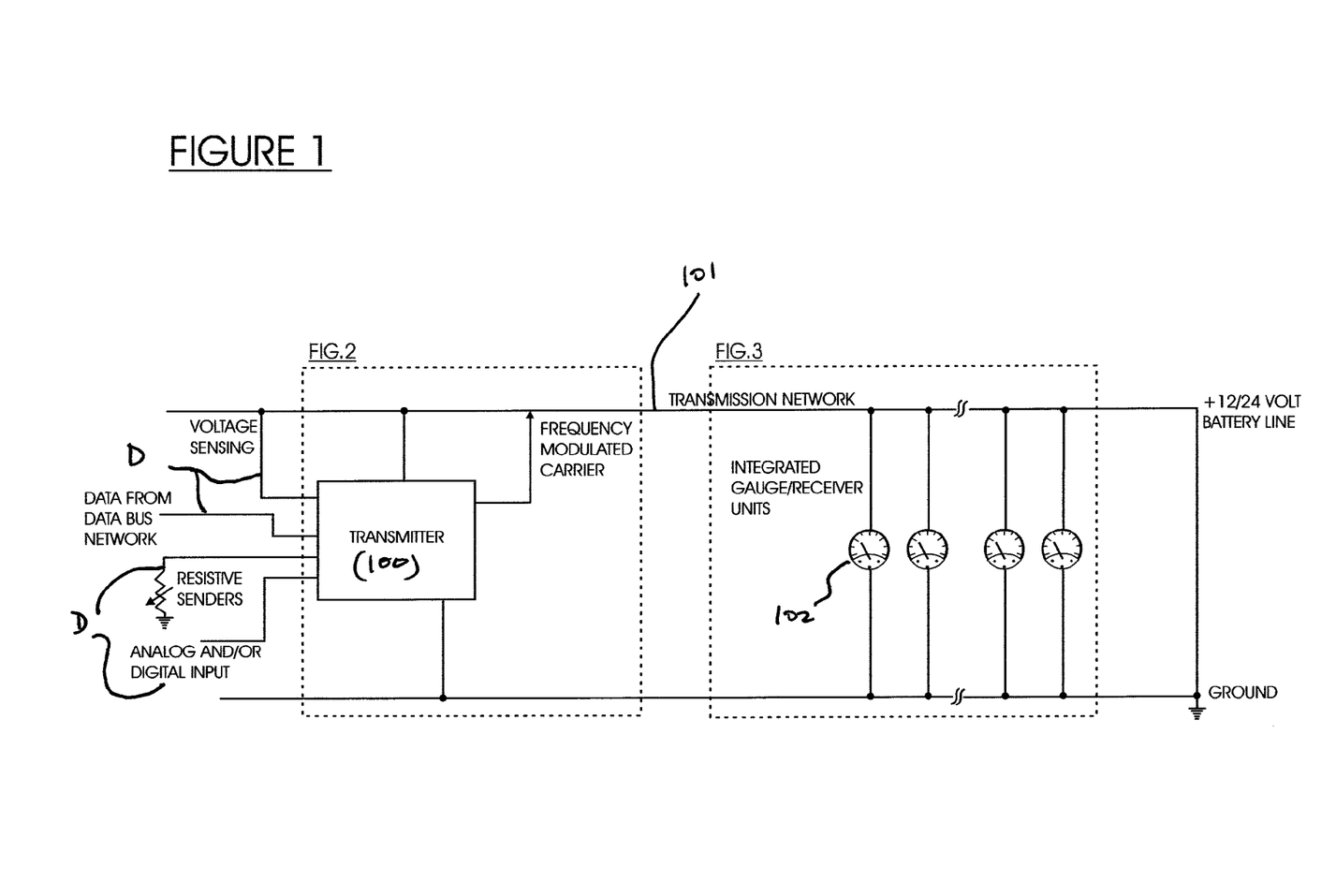
FIG. 1 shows a schematic of one embodiment of a generalized data transmission and display device.

As shown in FIG. 1, in one embodiment of the invention, the system comprises at least one data source (D), a transmitter unit (100) and at least one integrated gauge/receiver unit (102). The transmitter (100) gathers data from the data source or plurality of sources (D), which may be a voltage output sensor, input from a data bus network, resistive sensors, analog or digital data, or any other form of data input. The nature of the data source is not an essential element of the invention. The transmitter (100) then organizes the data it has collected and impresses it on the transmission network (101) as a frequency modulated carrier. The transmission network (101) may consist of a direct current battery line, such as the 12V or 24V power line in automotive electrical system, or any other uncommitted wire. The integrated gauge/receiver unit (102) is connected to the transmission network from which it receives the frequency modulated carrier. This device (102) then filters the frequency modulated carrier, amplifies it, extracts the appropriate data from it, and finally displays the data in a human readable display. In a preferred embodiment, the gauge display is an analog display, such as a conventional needle and dial. The needle may be actuated by conventional and well known types of gauge movements.

Preferably, the transmitter (100) gathers data from a plurality of different sources, equivalent to the number of gauge/receiver units (102) required or desired. Furthermore, it is preferable that the gauge/receiver units (102) and the data transmitter (100) be connected solely by the power line transmission network, disregarding any ground connections.

Figure 2:
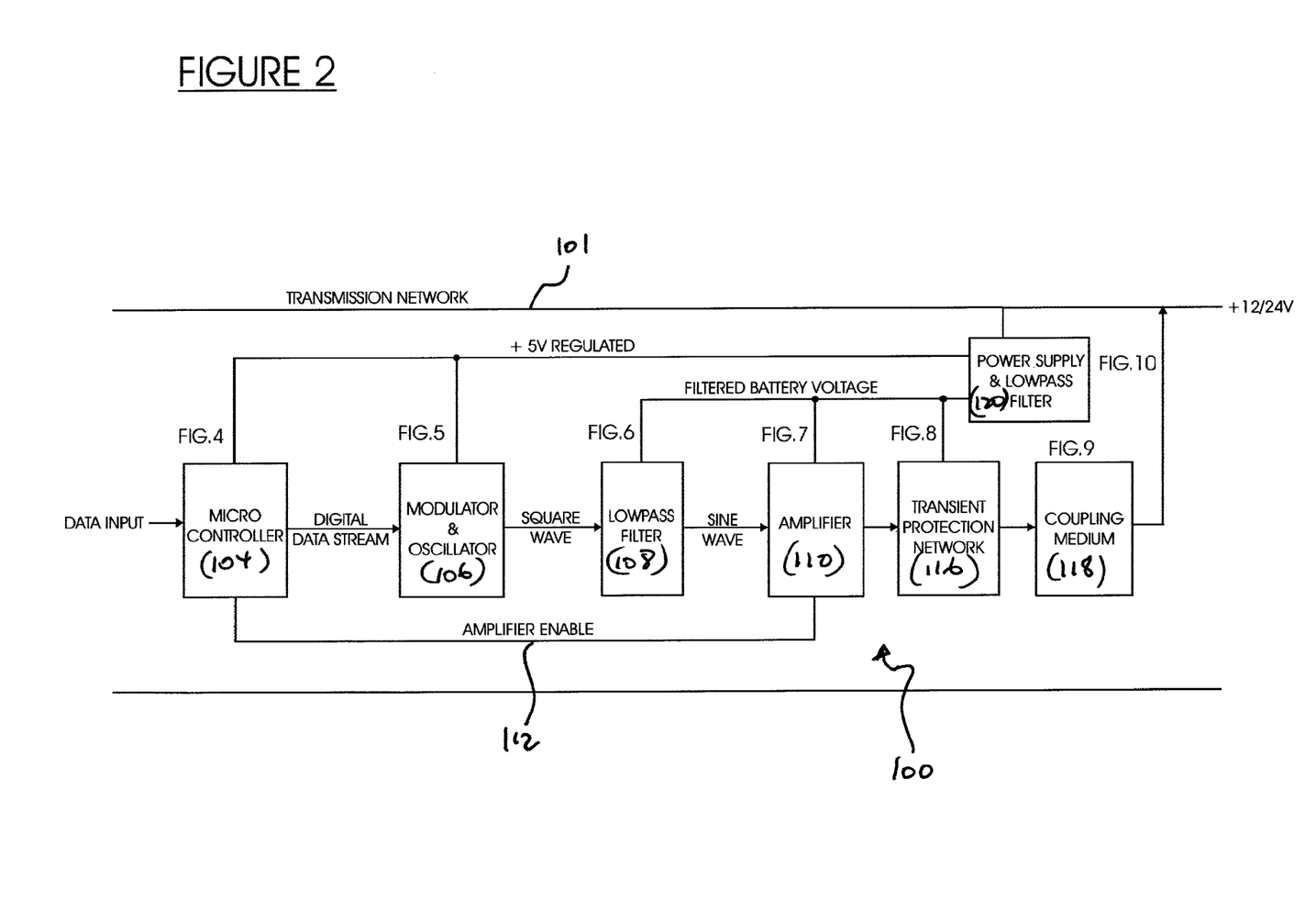
FIG. 2 shows a data transmission unit.

As shown in FIG. 2, the transmitter (100) comprises a microcontroller (104) which receives data from the data source or sources (D). The transmitter microcontroller (104) converts the data to a digital data stream, which is then applied to the modulator and oscillator (106). The data stream may comprise data from a plurality of data sources, where the data from different sources may be distinguishable from each other and each may comprise a unique identifier.

The output of the modulator and oscillator is a square wave of varying frequency which is the frequency modulated carrier. The square wave is then passed on to the lowpass filter (108) which eliminates the higher harmonics of the square wave creating a sine wave. This sine wave is fed to the amplifier (110) which amplifies the low level sine wave. The amplifier (110) is turned on and off by the amplifier enable line (112) from the microcontroller (104). The signal coming from the amplifier (110) is preferably passed through a transient protection network (116), which serves to protect the microcontroller (104), modulator and oscillator (106), the lowpass filter (108) and amplifier (110) from transient voltages on the transmission network (101).

The carrier signal then continues to the coupling medium (118) where it is impressed onto the transmission network (101) by means of a capacitor or a transformer. The power supply and the lowpass filter (120) supplies power to the components of the transmitter (100) as shown in FIG. 2. Preferably, the signal impressed onto the transmission network (101) is a multiplexed signal from the plurality of data sources which input to the transmitter (100). As used herein, "multiplexed" means to combine several signals into one composite signal for transmission, in such a way that they can be received, separated, and used.

Figure 3:
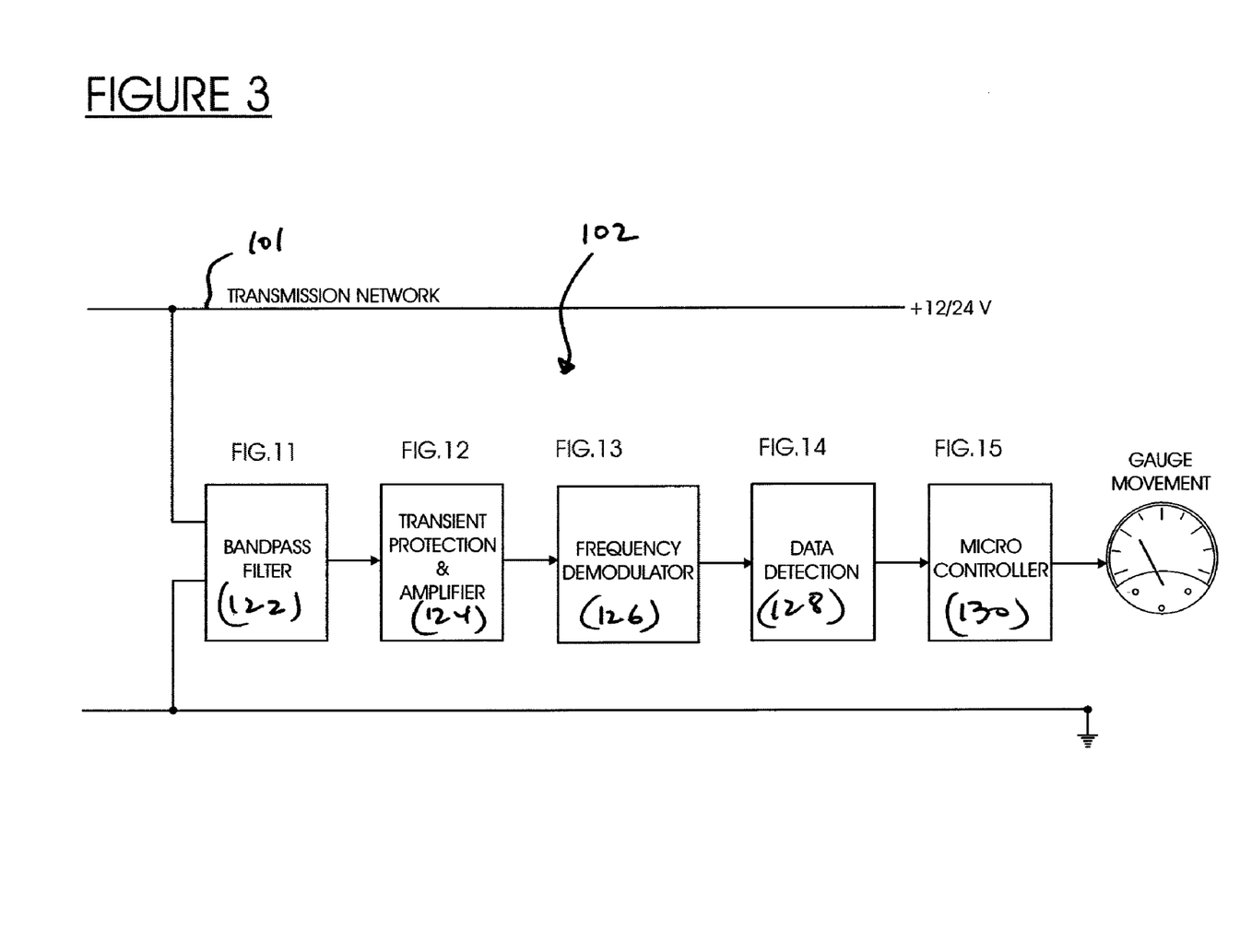
FIG. 3 shows an integrated gauge/receiver unit.

As shown in FIG. 3, the integrated gauge/receiver unit (102) receives the frequency modulated carrier sine wave from the transmission network (101) which is then passed through a bandpass filter (122). The bandpass filter allows only the frequencies of interest to pass and continue onward to the transient protection network and amplifier (124), which serves to protect circuitry from transient voltages and to amplify the signal. The frequency modulated carrier continues on to the frequency demodulator (126) where the signal is demodulated. The next step is data detection (128) where the signal data is filtered and amplified to logic levels. From here it is passed on to the receiver microcontroller (130) where it is converted to a signal to drive the gauge display. In a preferred embodiment, the gauge display may be a well-known analog display, such as a needle on a dial. If the data signal includes a signal to turn on a warning light, the microcontroller (130) may comprise a separate output to the warning light, whether or not the warning light is integrated into the gauge display.

Figure 4:
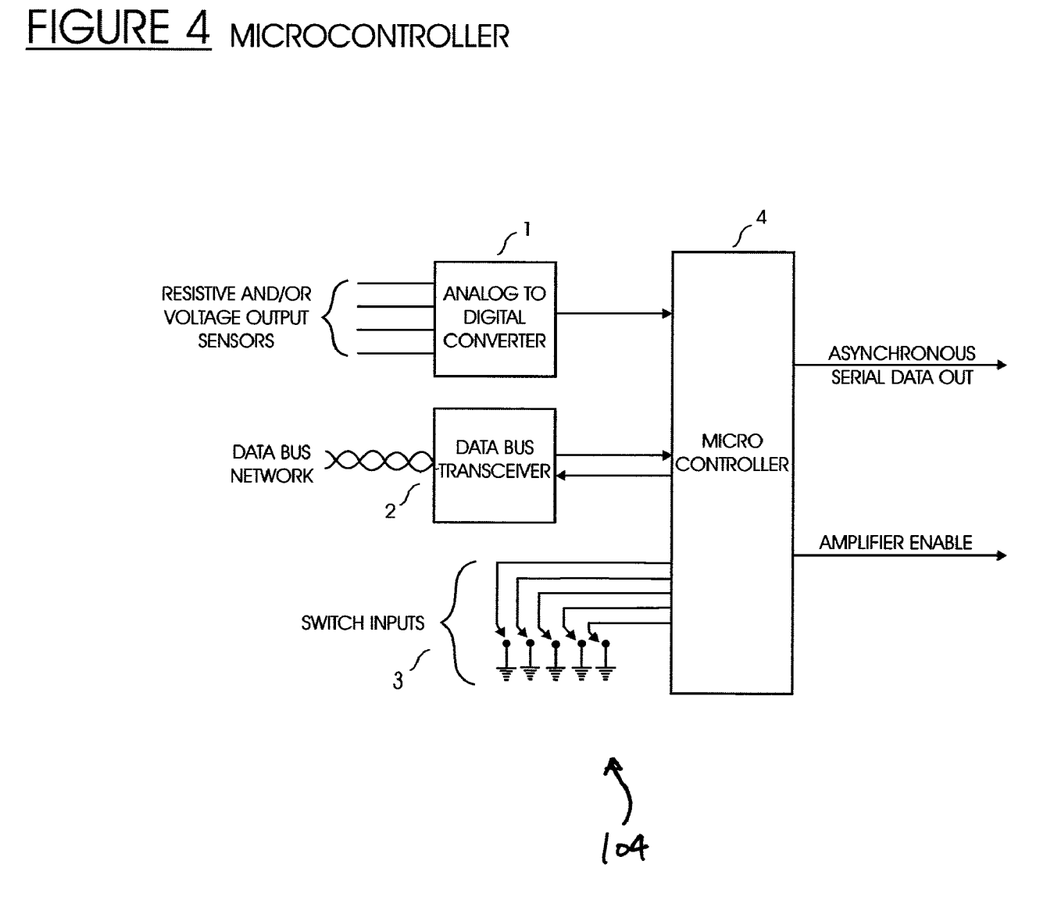
FIG. 4 shows a microcontroller used to gather and control data.

FIG. 4 shows a detailed schematic of one embodiment of the transmitter microcontroller (104). There are various different types of data input possible and in one embodiment of the invention, the data sources include resistive sensors, voltage output sensors, input from any data bus network and switch inputs. Resistive and/or voltage output sensor information is first converted by an analog to digital converter (1) into a digital format before it can be sent to the microcontroller (4). The data bus network may be buffered by a data bus transceiver (2) which acts as a bridge to the microcontroller (4). Switch inputs (3) however can be directly applied to the microcontroller (4). In a preferred embodiment, each data parameter is processed and tagged with a unique identifier before being sent to a message buffer. The contents of the message buffer are periodically transmitted via a data port, such as an asynchronous serial data port. Before transmitting, the amplifier enable line must be activated by the microcontroller (4) and when the transmission is complete, it must once again be deactivated by the microcontroller (4).

In a preferred embodiment, the amplifier is enabled and the data transmitted only periodically. In one embodiment, the message buffer contents are transmitted several times a second, where each transmission may last only about 20 milliseconds. As a result, data transmission over the transmitter network (101) is not continuous, and more preferably minimized.

Figure 5:
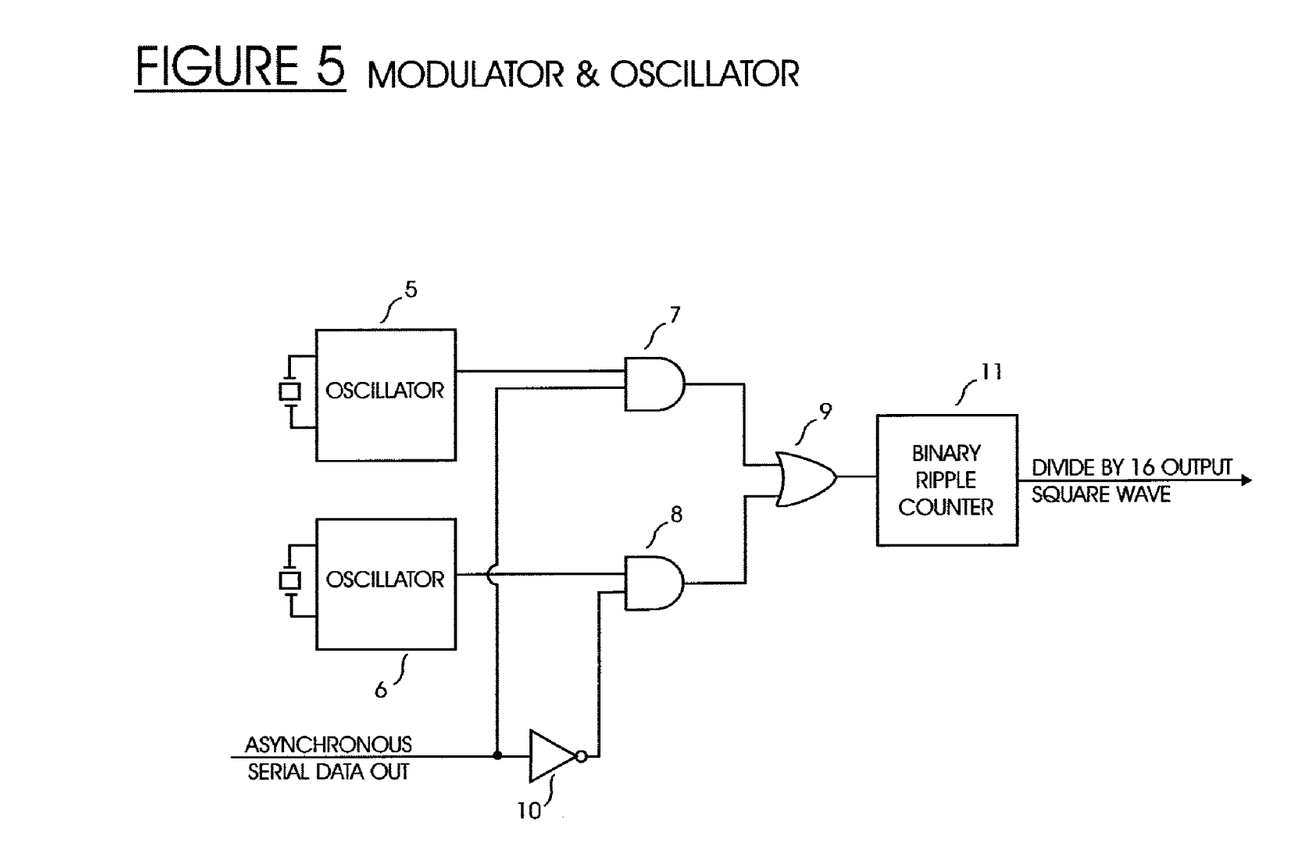
FIG. 5 shows the generation of a frequency modulated square wave.

FIG. 5 shows a detailed schematic of the modulator and oscillator (106). In one embodiment, the asynchronous serial data stream from FIG. 4 is used to select one of two crystal oscillators (5, 6). If the data bit is a "1", a first oscillator (5) is selected by means of AND gate (7). If the data bit is a "0", a second oscillator (6) is selected by means of AND gate (8). Only one of the oscillators can be selected at a time because of inverter (10). The outputs of AND gates (7,8) are logically OR'd in OR gate (9). Preferably, the wave train would then be divided by an integer such as 16 in a binary ripple counter (11) so that high frequency crystals can be used in oscillators (5, 6). The output will be a square wave and may have a frequency greater than about 50 KHz and preferably greater than about 75 KHz. In one embodiment, the wave has a frequency in the range of about 100 KHz to 500 KHz. For example, when oscillator (5) is 4.194304 MHz and oscillator (6) is 4.00 MHz, then a data "1" results in a frequency of 262.144 KHz and a data "0" results in a frequency of 250 KHz. In alternative embodiments of the invention, a voltage controlled oscillator or any other means of frequency modulating the carrier may be used. Such alternatives are well known to those skilled in the art.

Higher frequency signals tend to attenuate rapidly, while lower frequency signals suffer from low signal to noise ratios. In a noisy environment such as an automotive power system, lower frequency signals may not be suitable.

Figure 6:
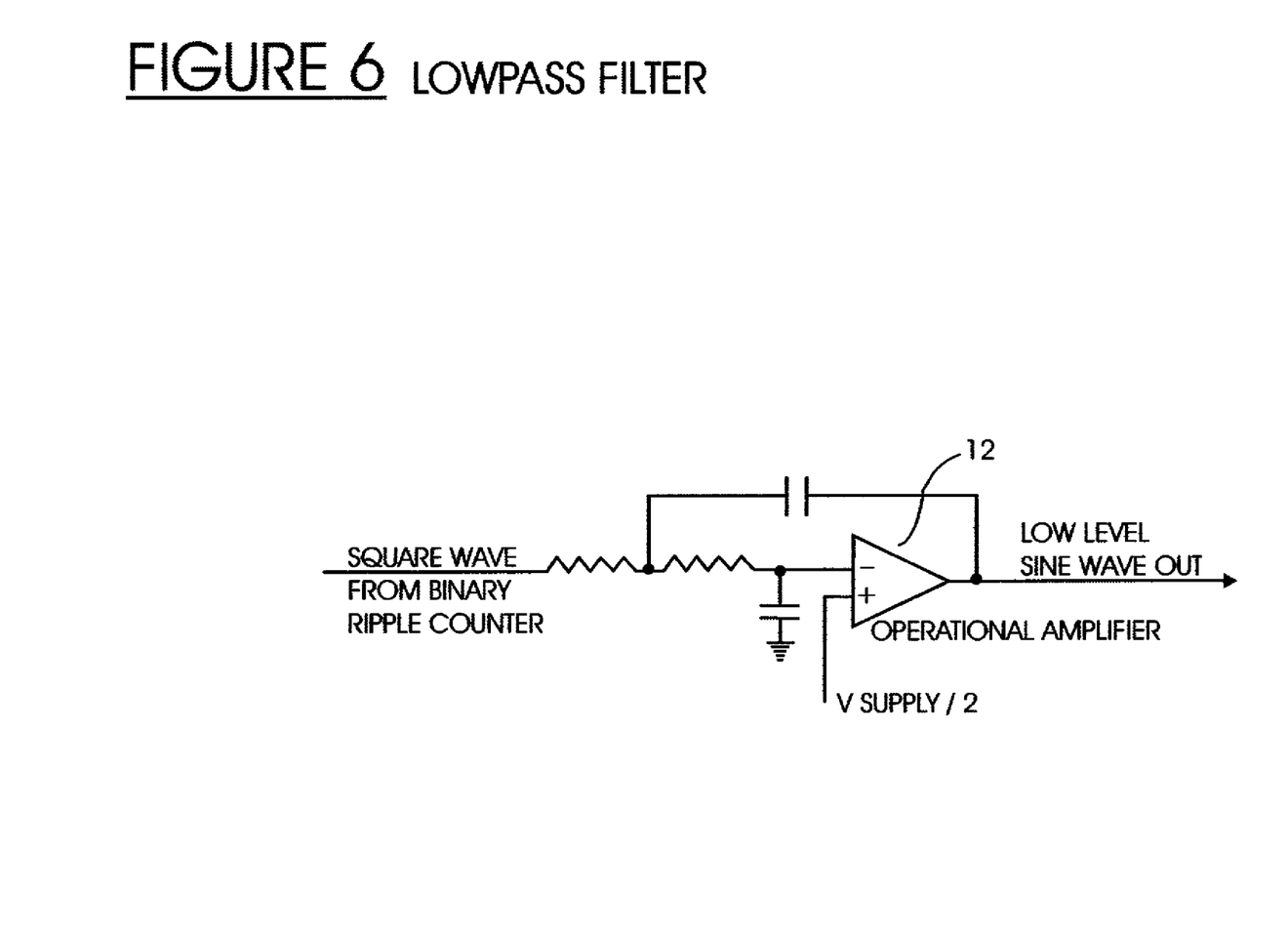
FIG. 6 shows a lowpass filter.

A schematic of the lowpass filter (108) is shown in FIG. 6. In this embodiment of the invention, a simple active lowpass filter using an operational amplifier (12) is used. The function of the filter is to remove the higher harmonics of the square wave so that the output will be a low level sine wave.

Figure 7:
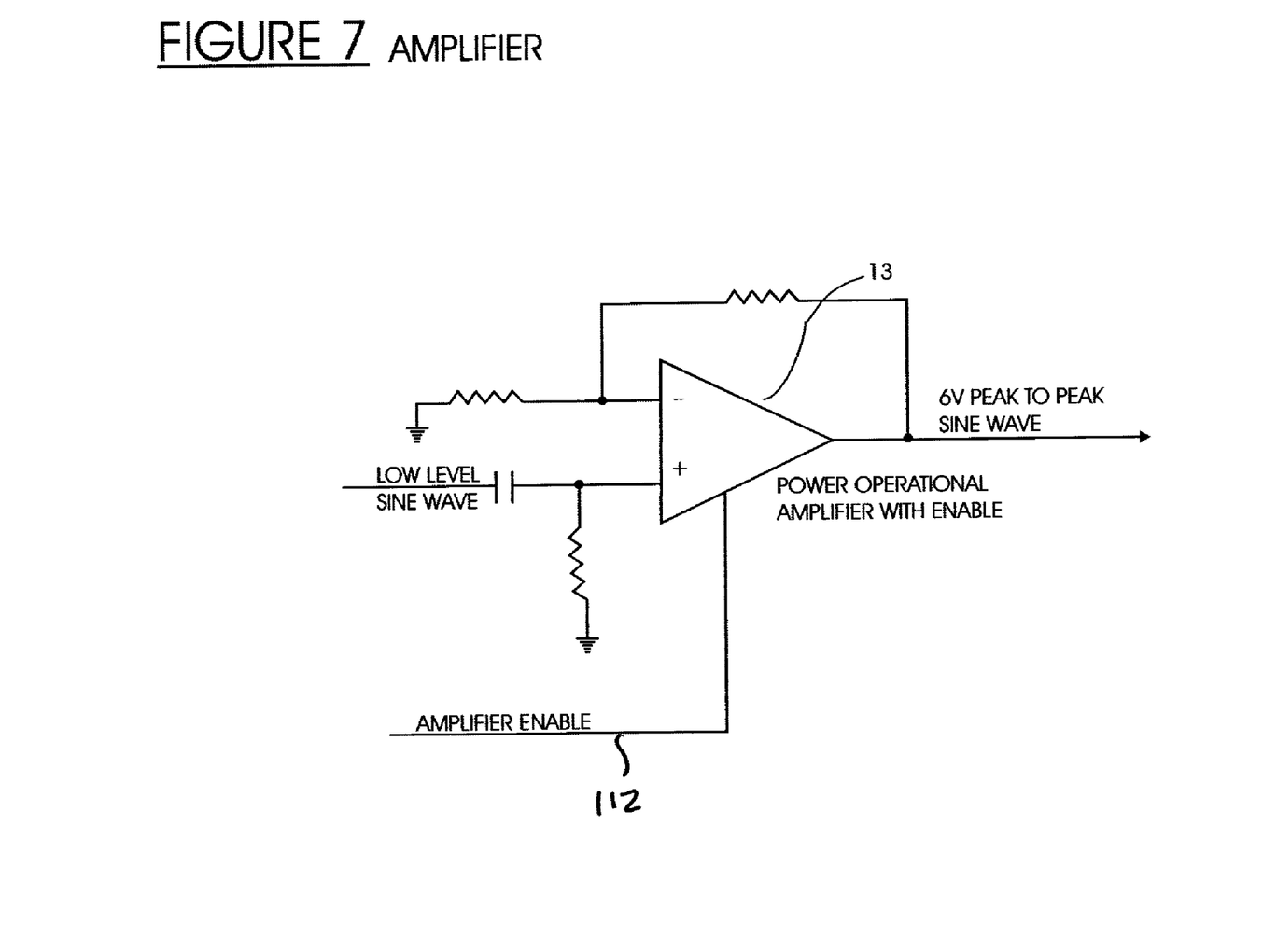
FIG. 7 shows an amplifier for driving the low impedance transmission network.

FIG. 7 shows in more detail the transmitter amplifier (110), which amplifies the low level sine wave from the lowpass filter (108) to a sine wave of suitable level. In one embodiment, the sine wave is amplified to 6 Volts peak to peak. The output of the operational amplifier (13) must be able to drive the low impedance of the transmission network (101), which may be lower than 1Ω. Preferably, the amplifier enable line (112) has the ability to enable the output of the operational amplifier (13) only for the duration of the message being transmitted, reducing the heat emitted by the amplifier.

Figure 8:
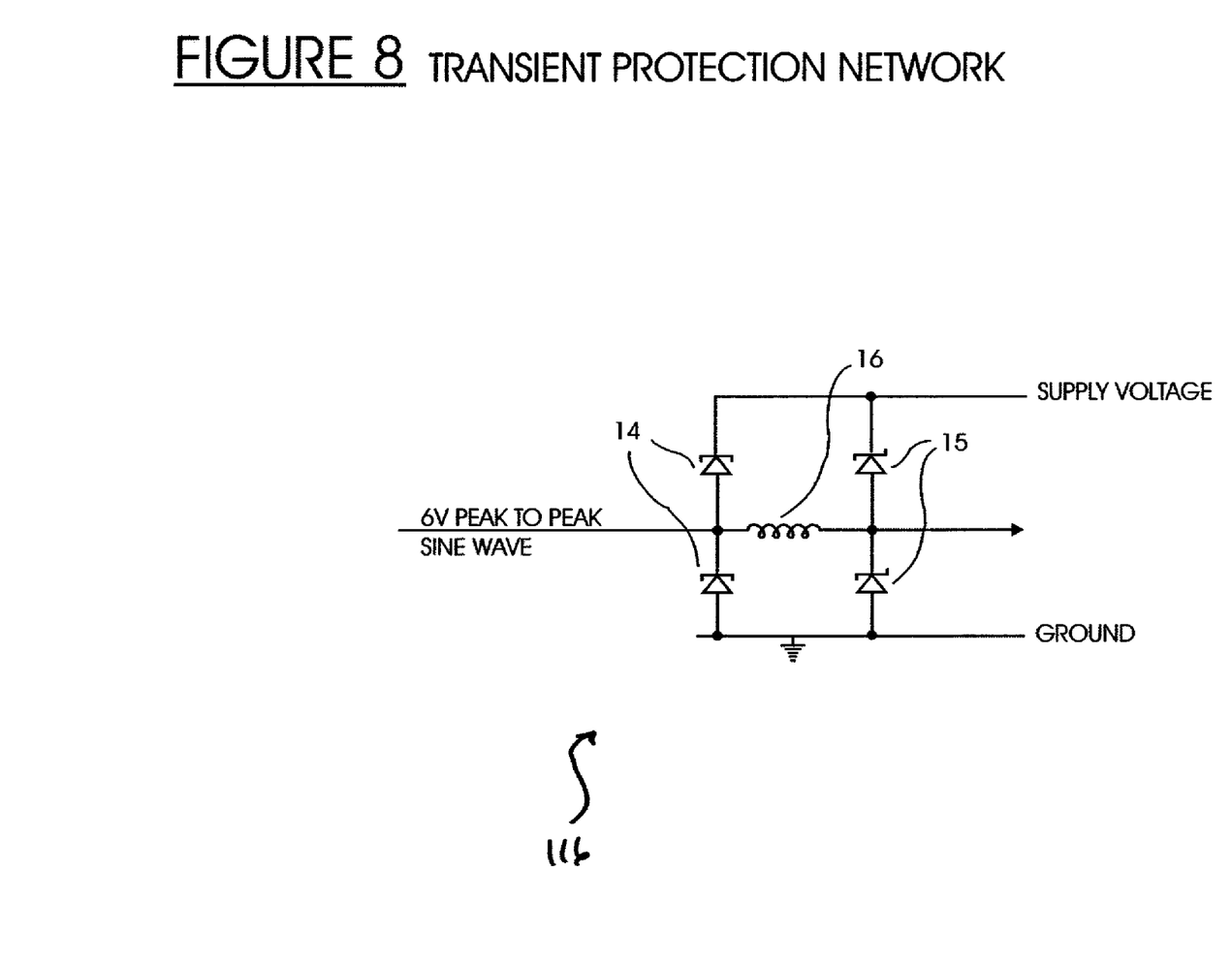
FIG. 8 shows a transient voltage protection circuit.

An optional transient protection network (116) is shown in FIG. 8. The transient protection network protects the components in the transmitter (100) from transient voltages. The transient voltage suppression diodes (15) limit incoming voltage spikes to +/36V. In one embodiment, fast rise time wave forms are attenuated by inductor (16) and final voltage clamping is performed by Schottky diodes (14).

Figure 9:
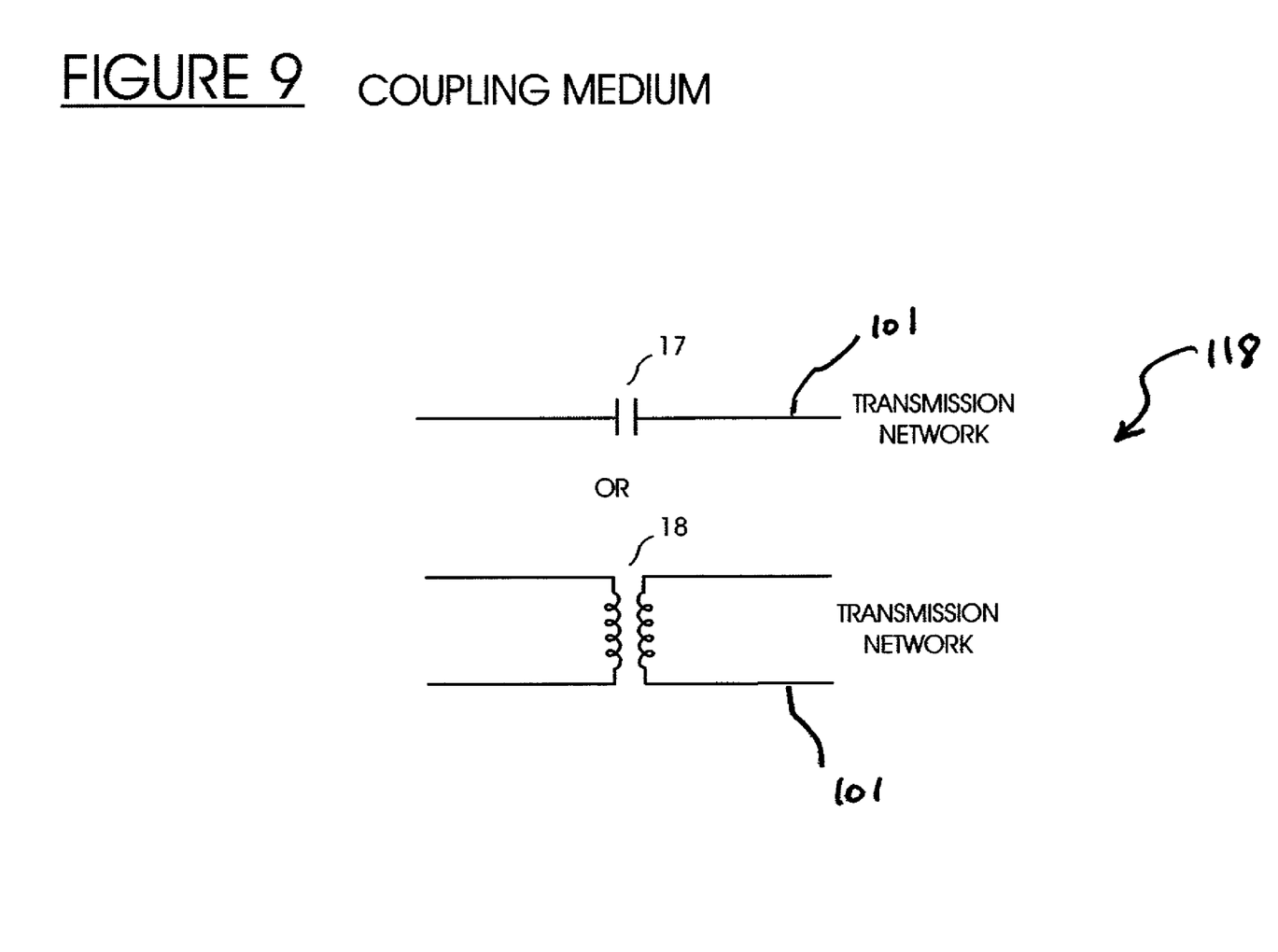
FIG. 9 shows two alternative methods to couple the signal to the transmission network.

FIG. 9 shown in more detail the coupling medium (118) which connects to the transmission network (101). The signal to be transmitted from the transient protection network (116) may be coupled to the transmission network (101) by capacitative means (17) or a transformer (18), as is well known in the art.

Figure 10:
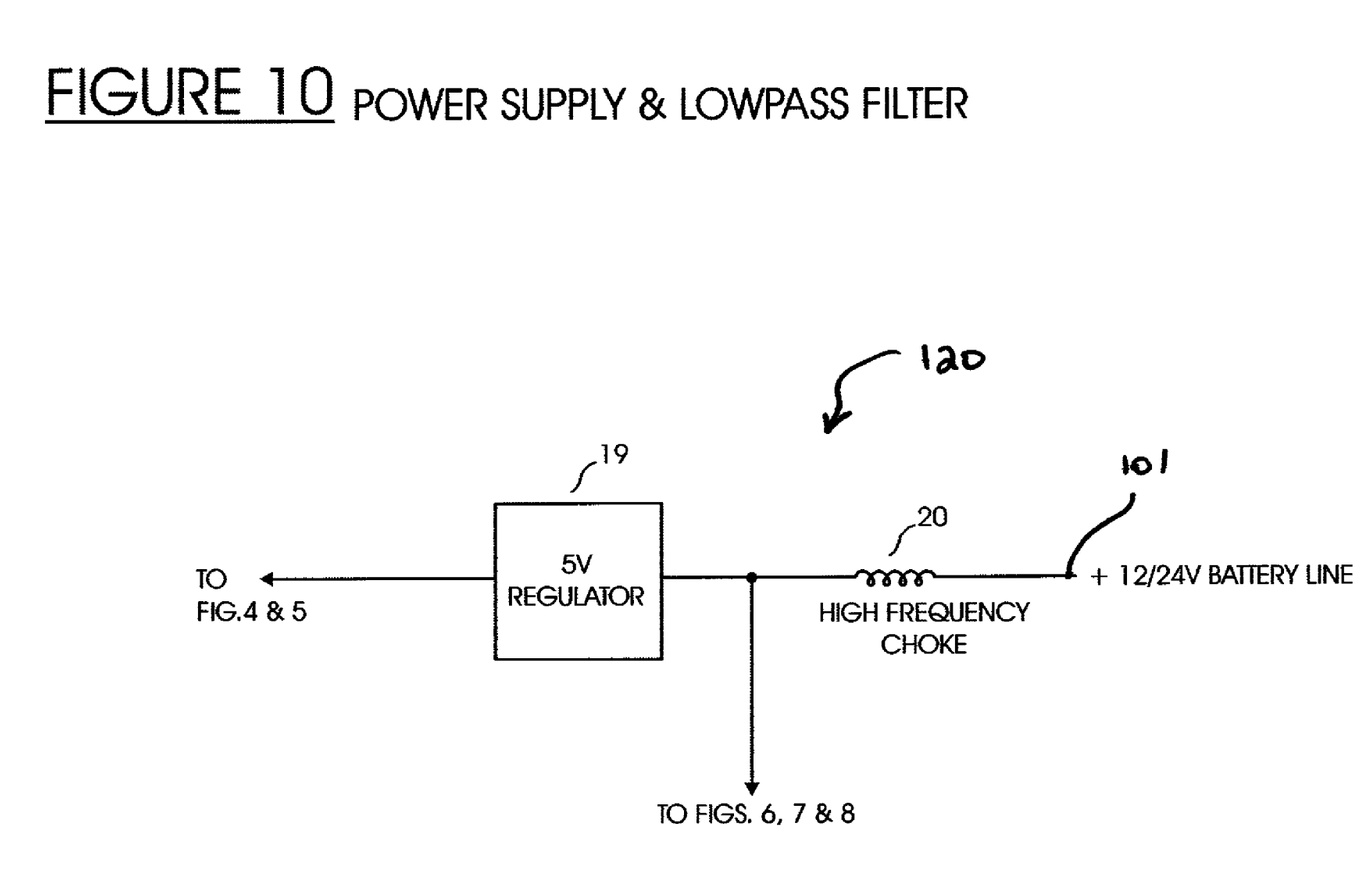
FIG. 10 shows details of a power supply.

The power supply and lowpass filter of the integrated receiver gauge unit (102) is shown in FIG. 10. In this embodiment of the invention, voltage regulation for components of integrated gauge/receiver unit (102) is handled by a 5V voltage regulator (19) and high frequency isolation is performed by a high frequency choke (20).

Figure 11:
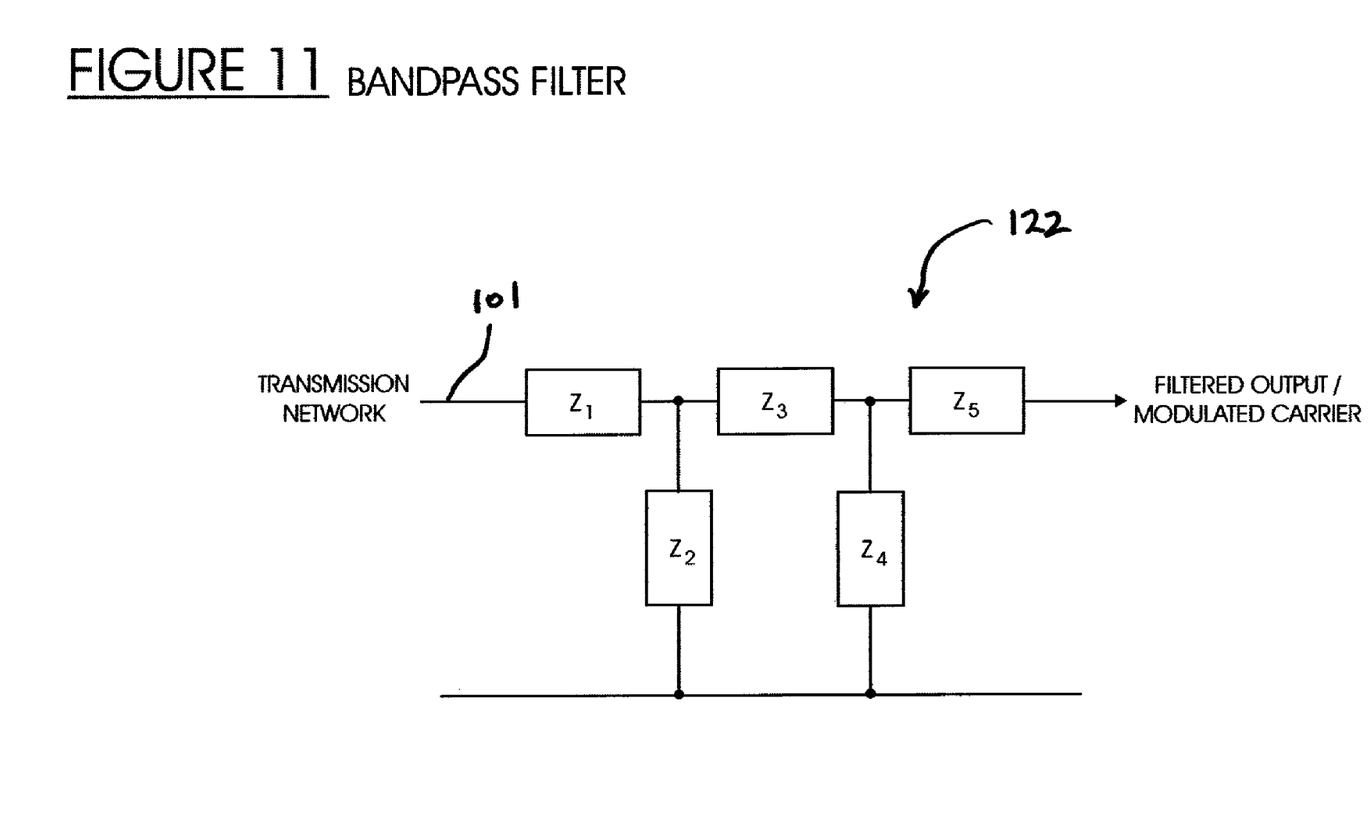
FIG. 11 shows a bandpass filter.

The bandpass filter is shown schematically in FIG. 11. This filter eliminates or attenuates outnoise. Bandpass filters are well-known in the art and full details are not shown but will be apparent to a person skilled in this field.

Figure 12:
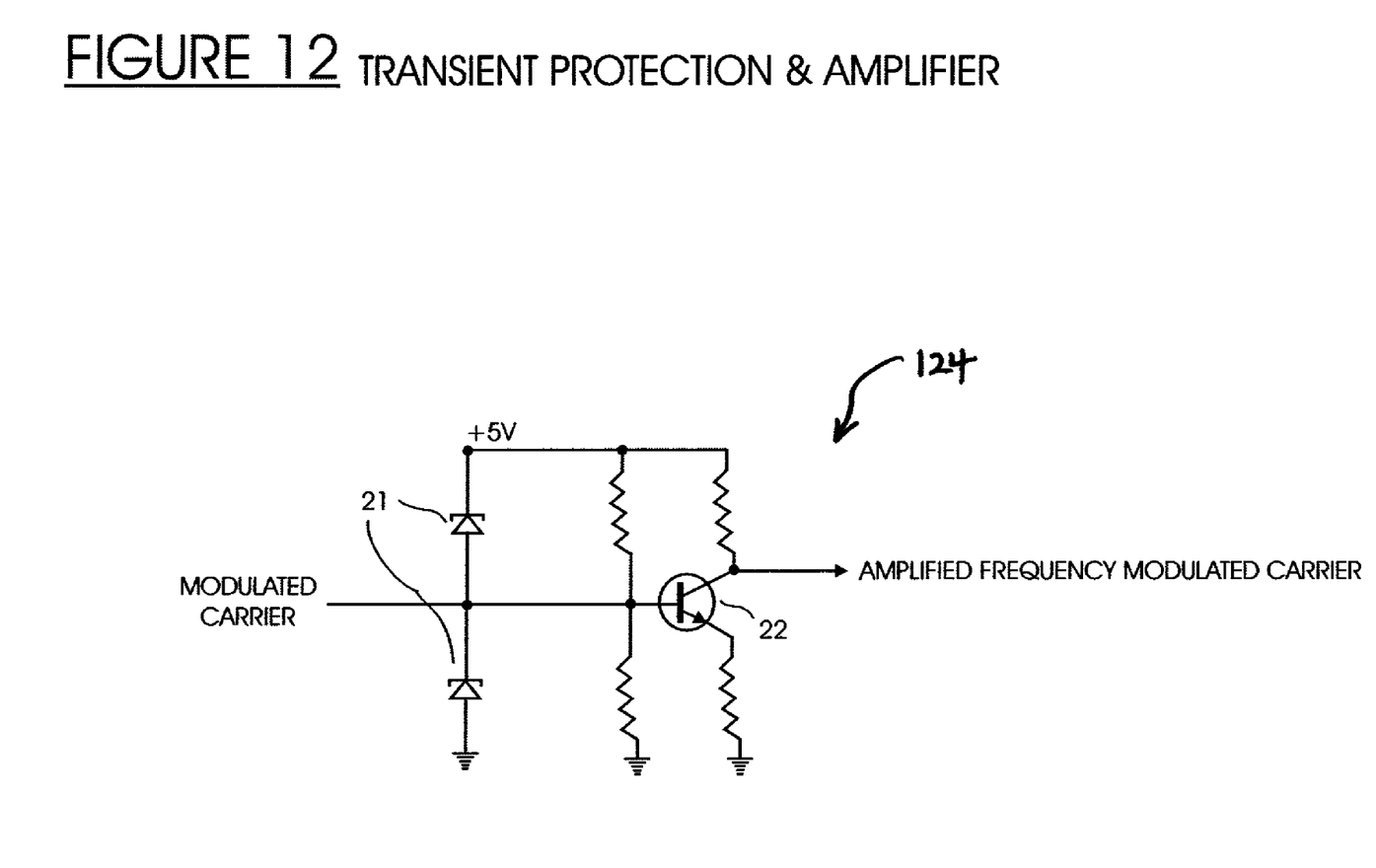
FIG. 12 shows a simple amplifier.

FIG. 12 shows in more detail the transient protection and amplifier (124) of FIG. 3. In one embodiment of the invention, FIG. 12 consists of a simple transistor amplifier (22) with transient protection Schottky diodes (21). The amplifier preferably has a gain of at least ten. Other configurations can be employed and will be apparent to those skilled in the art.

Figure 13:
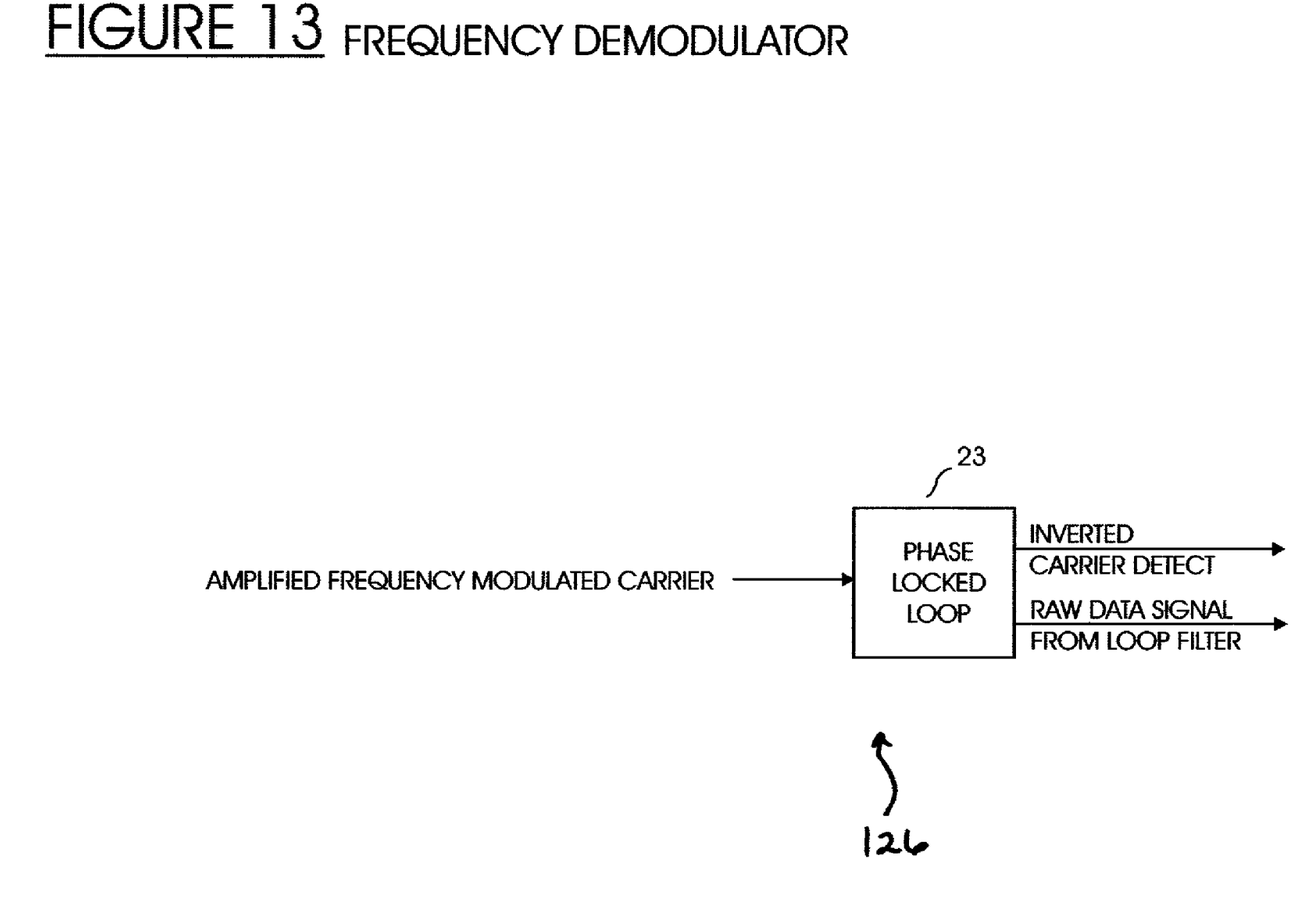
FIG. 13 shows recovery of a signal using a phase locked loop.

FIG. 13 shows in more detail the frequency demodulator (126) of FIG. 3. In one embodiment of the invention, a phase locked loop or PLL (23) recovers the raw data signal from the amplified frequency modulated carrier; however, there are other methods to achieve the same result which are well-known to those skilled in the art. Preferably, the PLL (23) also provides an inverted carrier detect which is used in the data detector (128).

Figure 14:
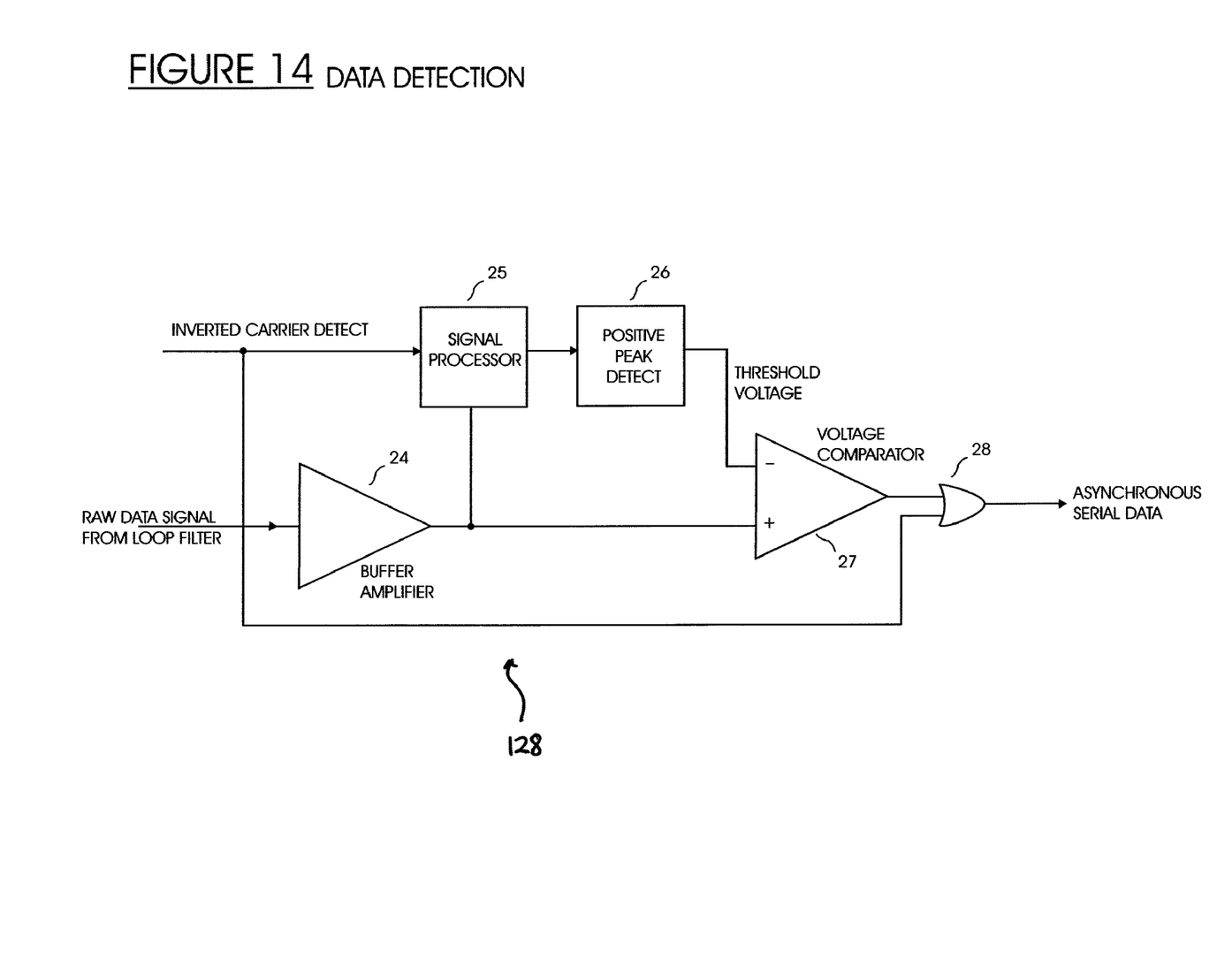
FIG. 14 shows data recovery signal processing.

Means for data detection in the integrated gauge/receiver unit (102) is shown schematically in FIG. 14. In one embodiment, the data detector (128) further processes the data signal recovered from the PLL filter (23) which is likely to be weak and noisy. First, the signal is buffered (24) so as not to load down the PLL filter (23). The raw signal is then sent to a voltage comparator (27) where it is compared to a threshold voltage. The comparator (27) outputs a "1" if the data voltage is greater than the threshold voltage and outputs a "0" if the data voltage is less than the threshold voltage. The threshold voltage is supplied by a positive peak detector circuit (26). Between the peak detector (26) and the buffer amplifier (24) is a signal processor (25). The signal processor (25) blocks signal transmission to the positive peak detector (26) when no carrier is present. During the period when no carrier is present the input of the peak detector (26) is held at ground potential so that the threshold voltage can decay to a low level before the next message arrives. When a carrier is present, the signal, minus an offset voltage of one half of the signal excursion, is allowed through to the peak detector (26). The output of the voltage comparator (27) is logically OR'd with the inverted carrier detect signal. Regardless of the state of the voltage comparator (27), when no carrier is present the output of OR gate (28) will always be a logic "1".

Figure 15:
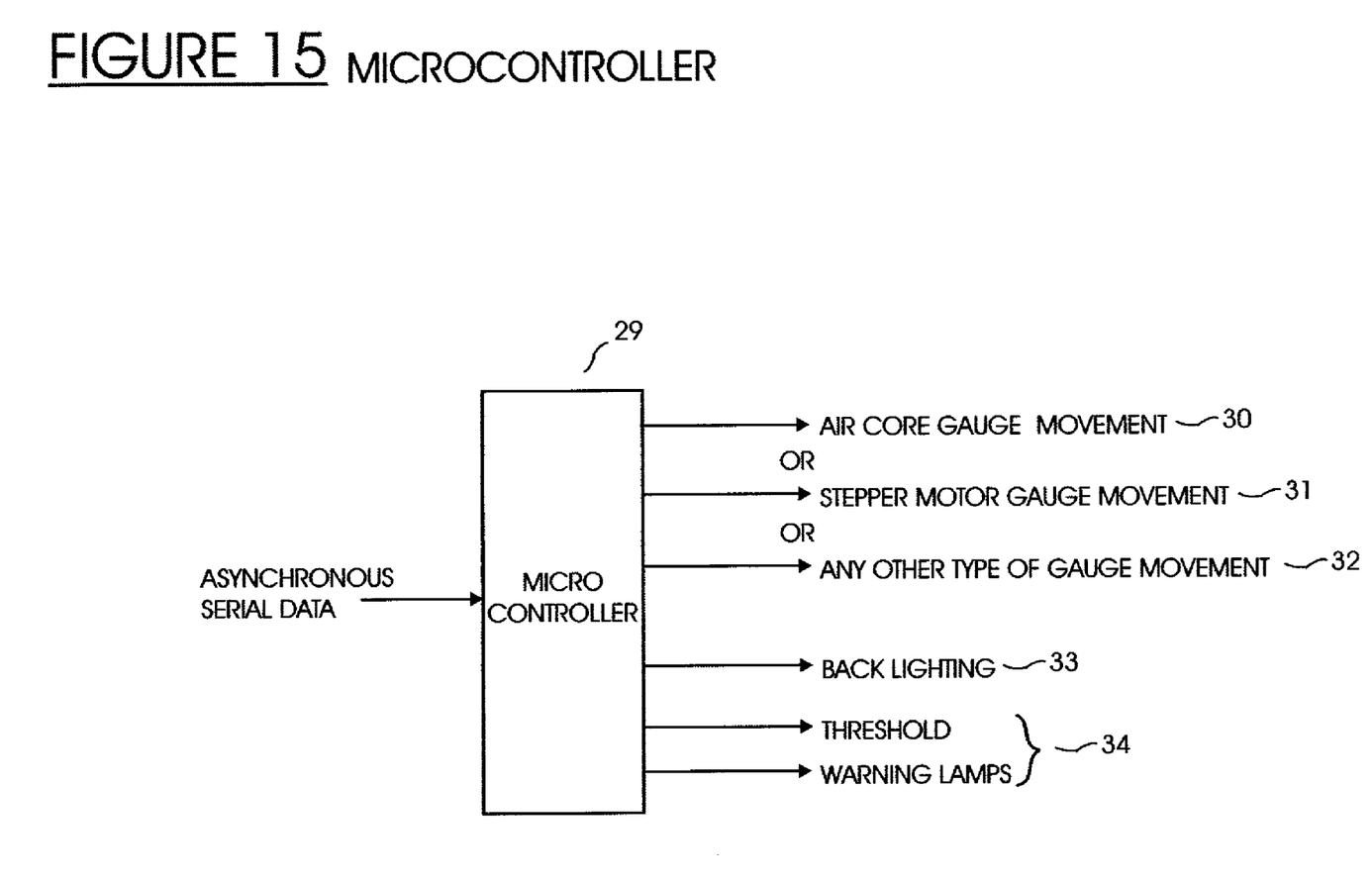
FIG. 15 shows a microcontroller used in an integrated gauge/receiver unit to receive, process and display data.

FIG. 15 is the detail of the microcontroller (130) shown in FIG. 3. The microcontroller (29) receives the asynchronous serial data from the data detector (128) shown in FIG. 14. The data is processed and used to drive a gauge display, such as an air core gauge movement (30). Alternatively, the gauge display may comprise a stepper motor gauge movement (31) or any other type of gauge movement (32). The microcontroller (29) may also control the gauge backlighting (33) from a value sent by the transmitter (100). Additionally, it may control one or several threshold warning lamps (34) which are activated when the threshold of the warning lamp of the addressed gauge has been reached. The thresholds are configurable in the transmitter (100). The warning lamp may comprise an LED.

As will be apparent to those skilled in the art, various modifications, adaptations and variations of the foregoing specific disclosure can be made without departing from the scope of the invention claimed herein. The various features and elements of the described invention may be combined in a manner different from the combinations described or claimed herein, without departing from the scope of the invention.

What is claimed is:

1. A data display system comprising:
 (a) at least one data source;
 (b) a data transmitter coupled to the at least one data source and to a transmission network comprising a power line; wherein the data transmitter comprises means for modulating the data as a frequency modulated carrier and means for transmitting the carrier over the power line;
 (c) at least one gauge having a display and coupled to the power line, and a data receiver comprising means for demodulating the carrier and means for translating the data to the display;
 (d) wherein the at least one gauge is coupled to the data transmitter only by the power line, disregarding any ground connections, and wherein the power line provides power to both the at least one gauge and the data transmitter.

2. The system of claim 1 comprising a plurality of data sources, a single data transmitter and a plurality of gauges, wherein each data source has a corresponding gauge, and the transmitter outputs a carrier combining the data sources.

3. The system of claim 2 wherein each of the gauge displays comprises a human readable analog display.

4. The system of claim 1 wherein the modulation means outputs a square wave having a frequency of at least about 50 KHz.

5. The system of claim 4 wherein the modulation means outputs a square wave having a frequency of at least about 75 KHz.

6. The system of claim 5 wherein the modulation means outputs a square wave having a frequency between about 100 KHz and 500 KHz.

7. The system of claim 4 further comprising means for removing higher harmonics of the square wave output prior to signal amplification.

8. The system of claim 4 wherein the carrier transmission means comprises an amplifier and a capacitative coupler or a transformer coupler.

9. The system of claim 1 wherein the gauge comprises a frequency demodulator, a data detector and microcontroller for translating the data to drive the gauge display.

10. The system of claim 1 wherein one or both of the transmitter and the gauge comprises a transient voltage protection device.

11. A method of connecting a gauge panel comprising a plurality of gauges to a plurality of data sources with a transmission network consisting of a power line, the method comprising the steps of:
    (a) providing power to each gauge and a data transmitter with the power line;
    (b) modulating the data received from the data sources as a frequency modulated carrier and transmitting the carrier over the power line; and
    (c) demodulating the carrier in the corresponding gauge, selecting data relevant to the corresponding gauge and displaying the relevant data as a human readable display.

12. The method of claim 11 wherein the data is first converted to an asynchronous serial data stream, and is then modulated to a frequency modulated square wave.

13. The method of claim 10 wherein the square wave is converted to a sine wave and amplified prior to transmission over the power line.

14. The method of claim 11 wherein the data is extracted from the carrier by a phase lock loop filter and a data detector comprising a voltage comparator.

15. The method of claim 11 wherein the carrier has a frequency greater than about 50 KHz.

16. The method of claim 15 wherein the carrier has a frequency greater than about 75 KHz.

17. The method of claim 16 wherein the carrier has a frequency between about 100 KHz and about 500 KHz.

* * * * *